United States Patent [19]

Liang et al.

[11] Patent Number: 5,233,500
[45] Date of Patent: Aug. 3, 1993

[54] PACKAGE FOR CASCADED MICROWAVE DEVICES

[75] Inventors: Guo-Chun Liang, Cupertino; Richard S. Withers, Sunnyvale, both of Calif.

[73] Assignee: Conductus, Inc., Sunnyvale, Calif.

[21] Appl. No.: 893,416

[22] Filed: Jun. 1, 1992

[51] Int. Cl.⁵ .............................................. H05K 7/00
[52] U.S. Cl. .................................. 361/728; 361/679; 361/740; 257/724; 257/678; 257/727
[58] Field of Search ...................... 357/74, 79, 75, 80; 361/386, 388, 392-396, 399, 400; 174/50, 51, 52.3, 52.5, 52.6

[56] References Cited

U.S. PATENT DOCUMENTS

| | | | |
|---|---|---|---|
| 4,603,344 | 7/1986 | Trommer | 361/386 |
| 4,685,034 | 8/1987 | Tetsu et al. | 361/424 |
| 4,990,462 | 2/1991 | Sliwa, Jr. | 357/80 |
| 5,057,970 | 10/1991 | Chave | 361/386 |
| 5,101,323 | 3/1992 | Prevost | 361/396 |

OTHER PUBLICATIONS

Withers et al., "Superconductive Delay-line Technology and Applications", IEE Transactions on Magnetics, vol. Mag-21, No. 2, Mar. 1985, pp. 1-7.

Primary Examiner—Gregory D. Thompson
Attorney, Agent, or Firm—Kimberley Elcess; James J. Leary

[57] ABSTRACT

A lobed package for the protection and electrical connection of microwave devices is presented. The distinctive shape of the package allows several large devices to be connected in series in a coplanar arrangement. In the preferred embodiment, a base layer is formed into a trefoil shape with a central raised pedestal. Three wafer sized modules are cut to fit together at 120° angles and are placed on the pedestal and electrically interconnected. A retaining shim is placed around the outside of the modules. An intermediate spring retaining plate with a recessed three-lobed well is placed atop the modules. Springs are placed in holes in the retaining plate. The springs are compressed by a cover plate placed on top of the retaining plate. Electrical connections are made to the cascaded device through the base or edge of the package. One application is to packaging three delay lines in series, each device occupying most of the space of a standard wafer.

14 Claims, 3 Drawing Sheets

PACKAGE FOR CASCADED MICROWAVE DEVICES

GOVERNMENT RIGHTS

This invention was reduced to practice with government support. The government retains certain rights in this invention.

FIELD OF THE INVENTION

This invention relates to a package for an electronic device. More particularly, the invention relates to a package suitable for enclosing a plurality of wafers in a coplanar arrangement so that electrical contact can be maintained between the patterns on the wafers at desired points.

BACKGROUND OF THE INVENTION

Microwave devices are electronic devices that operate in the frequency range of approximately 300 MHz to 300 GHz. Passive microwave devices include resonators, filters, and delay lines. Active microwave devices include amplifiers, receivers, and signal processing circuits. Microwave components can be made with normal metals or with superconductors. While normal metal technology is more mature, superconductive components often exhibit advantages in size, speed, and signal fidelity.

Devices, circuits, and systems operating at microwave frequencies require packages whose own frequency response does not limit or interfere with the performance of the components. Furthermore, even microwave devices made from normal metals perform better when cooled to low temperatures. Any package for these devices must therefore maintain its electrical and physical integrity over a wide temperature range.

Delay lines are used for short term storage of information in microwave circuits and systems. It is often desirable to make the delay time as long as possible without introducing excessive loss, or degradation of signal quality. Loss or degradation of the signal is controlled by both the inherent properties of the delay line and substrate materials, and the physical arrangement of the delay line device. Materials properties that are desirable for a delay line are low surface resistance in the delay line material and a low dielectric loss in the substrate material. Device designs or patterns should be chosen to decrease dispersion. These requirements sometimes compete, necessitating a compromise in the final device structure.

For a given configuration, the delay length, and therefore, the amount of short term storage available, may be increased in several ways. The line itself may be lengthened, narrowed, or patterned onto a thinner substrate. A longer line requires either a larger substrate area or a smaller spacing between parts of the line for tighter packing. A narrower line requires the width of the feature to be reduced. The substrate thickness is obviously reduced in the third option, leading to greater fragility. All of these options lead to increased complexity of processing, either because of the area over which a pattern must be maintained uniformly, the minimum feature size that must be repreoduced, or the care which must be taken to ensure the unity of the ultimate product.

It would be advantageous to process parts of the delay line structure independently and later put the pieces together to form a long delay line. This modular approach would allow pieces to be fabricated using comfortable technology, while providing an end product which fulfills the ultimate goal of a long delay line. Because there would now be many pieces to hold together, however, the modularity of the design would lead to more complex packaging requirements for the ensemble.

Discussion of the Prior Art

Currently packages for planar microwave delay lines are designed to contain structures fabricated over only one wafer diameter, usually about 5 cm. Typically the entire wafer is patterned to form the delay line or other microwave circuit. An example of a prior art package appears in FIG. 1. One such package is used routinely by MIT Lincoln Laboratory for protecting their microwave delay line devices and providing an electrical connection to other parts of the system. It is clear from this illustration that, while the package could be scaled up to accept wafers of larger diameter, the only way to add more wafers is to stack them vertically. This stacking introduces yet more complication to the interconnection scheme. Attempts have been made to connect two or more pairs of wafers in series and to secure them in a single package, but have been marred by the difficulties of vertical interconnection. See, for example, R. S. Withers, A. C. Anderson, J. B. Green, and S. A. Reible, "Superconductive Delay Line Technology and Applications," *IEEE Transactions on Magnetics*, vol. MAG-21, no. 2, March 1985, pp. 186–192. By stacking wafers delay line length can be increased while maintaining compactness, but it is difficult to make electrical connections between stacked wafers while maintaining good impedance and/or phase matching.

Objects and Advantages

It is therefore an object of this invention to allow the effective lengthening of a delay line or other electronic device by providing a convenient package for a planar arrangement of several wafers. The package allows the wafers to be securely placed in the desired configuration to maintain electrical contact between the device modules. Electrical contact to the outside world is permitted through the fixtures at the bottom or edge of the package. Once the package is assembled, the devices do not move, and may be tested and used for their intended purpose. The devices are well protected andmaintain their electrical connections during heating and cooling, even after many thermal cycles.

It is a further object of the invention to provide a convenient means of electrically interconnecting two or more wafer scale devices. The package in this case becomes a facilitator of integration. The robustness of the package diminishes concerns over the integrity of the connections between the parts of the device.

SUMMARY

In brief, the subject invention described here is a complete package for a microwave device which has been put together from two or more wafer-scale modules which have been truncated to fit together in a coplanar arrangement. The coplanar combination of at least two wafers is central to the invention, but the maximum number of wafers that could be cascaded in a similar package is limited only by pragmatism and the compromise between number of wafers connected and the area lost as waste during cutting.

The wafers themselves are securely fixed to the base of the lobed package. Space is left between the wafers to allow for thermal expansion. Once the wafers are set in position, interconnections are made between the wafers to complete the circuit. Contact is made to the ground planes of the devices by ribbon, foil, or solder from the top, bottom, and sides of the package. Electrical leads to the patterned device itself pass through holes in the base plate. The package is finally fastened together with screws, or is permanently welded or braised, and forms a unit which can be handled with little attention given to the fragility of the components it contains.

Connections between component modules are made by wire or ribbon bonding. Depending on the configuration of the component devices, wafers are bonded either at the center layer or at the top layer, or both. The wirebonds may go directly between the wafers, or the package may have a bar or ridge to which wires from the individual wafer modules are attached.

DESCRIPTION OF THE PREFERRED EMBODIMENT

Figure 1:
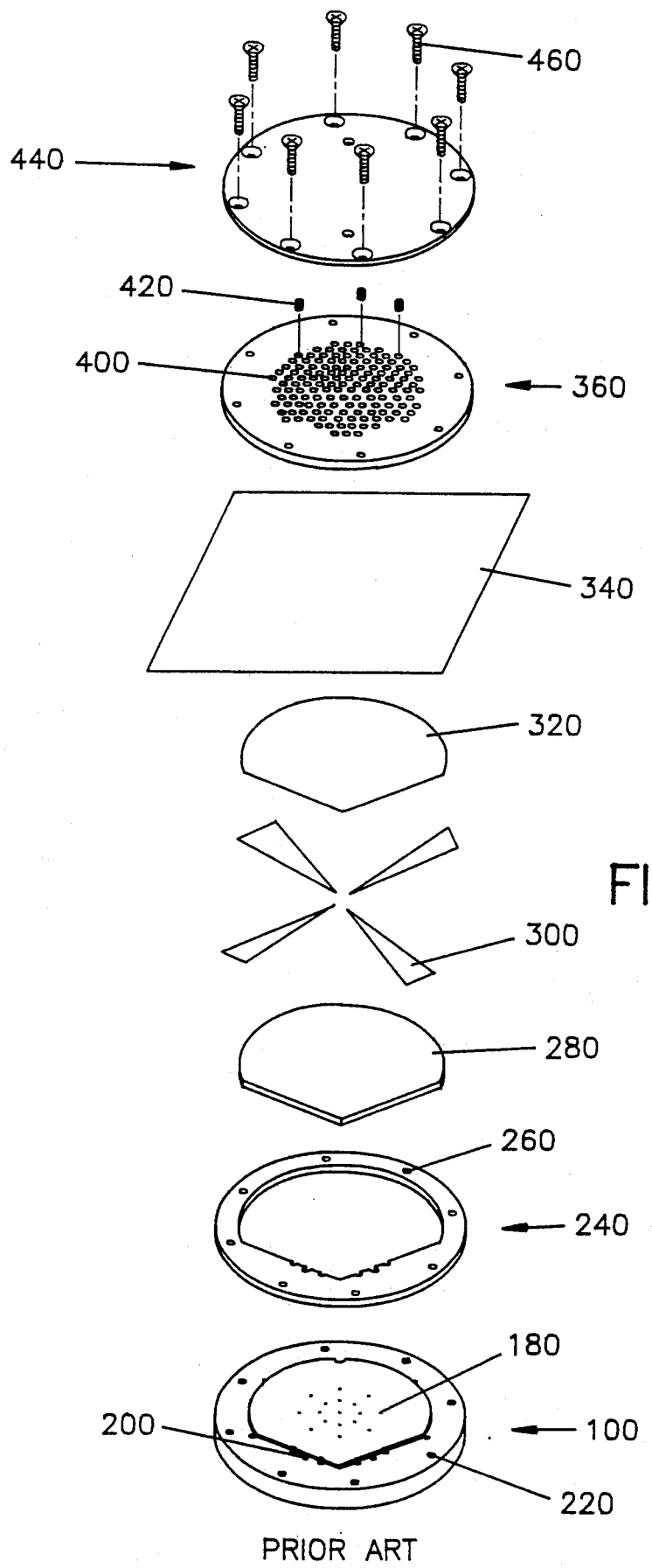
FIG. 1 is an exploded view of the prior art package.

An example of a prior art package for use with a single wafer is shown in FIG. 1. It consists of a base plate (100), a retaining ring (240), several foil vanes (300), a conformal layer (320), a foil layer (340), an intermediate spring retainer plate (360), springs (420), and a cover plate (440). The base plate (100) has small holes (180) for vacuum access and larger holes for making electrical contacts (200). During use a single wafer (280) rests on the base plate (100). The retaining ring (240) surrounds the wafer (280) without touching it. The spring retainer plate (360) is drilled with a number of holes (400) of appropriate diameter to accept the springs (420). After assembly the structure is held together by screws (460) which pass through holes (260) drilled into the edges of the cover plate (440), the intermediate spring retainer plate (360), and the retaining ring (240), and which are screwed into holes (220) drilled and tapped in the base plate (100).

Figure 2:
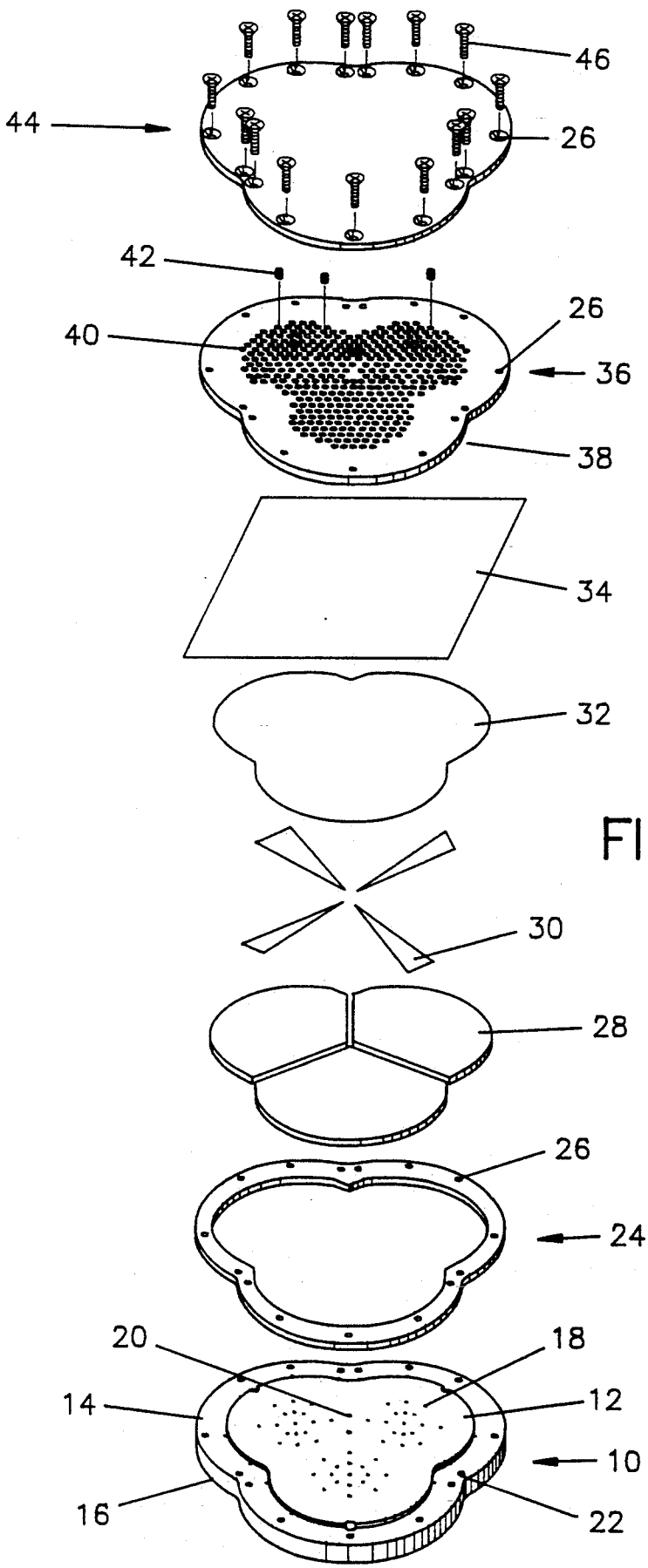
FIG. 2 is an exploded view of the three-lobed embodiment of the current invention.

The preferred embodiment of our invention is a trefoil or three-lobed package. An exploded view of the complete package is shown in FIG. 2. The base plate (10) is cut, machined, stamped, or molded into an overall three-lobed shape. The center portion is elevated, or the external portion is depressed depending on the fabrication method, so that wafers (28) may rest on the pedestal (12) without making physical or electrical contact with the edge (14) of the package. The bottom (16) of the base plate (10) is hollowed under the central portion of each lobe, forming three wells (48). Small holes (18) are formed, preferably by drilling, through the center of the pedestal (12). Air can be evacuated through these holes, so that a wafer can be placed on the pedestal and held in place for alignment during bonding prior to permanent fixing in the package.

Figure 3:
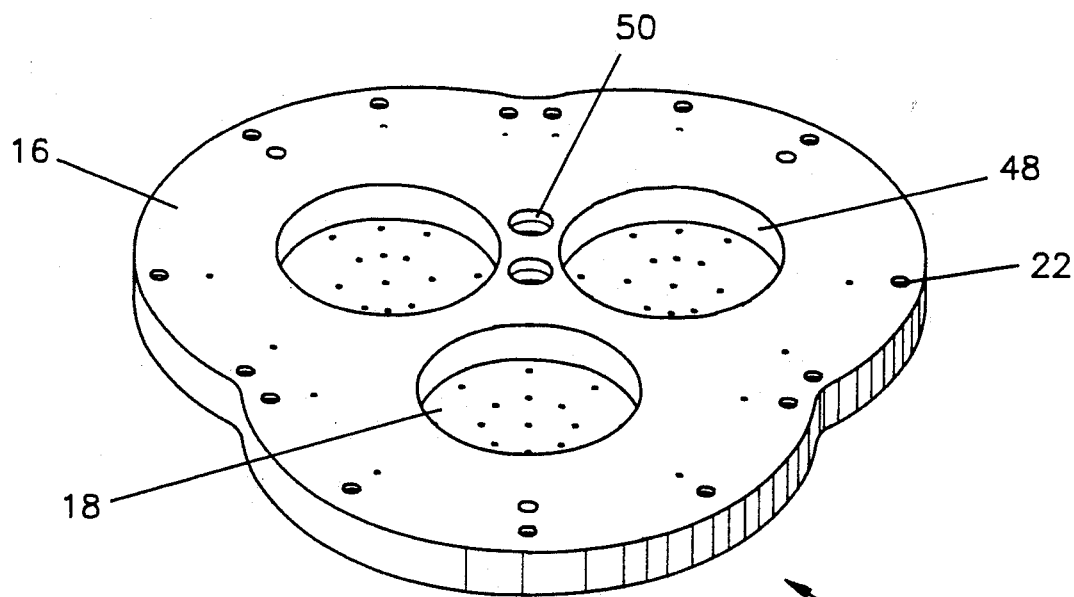
FIG. 3 is a perspective view of the bottom of the base plate of the current invention.

Referring again to FIG. 2, two electrical feedthroughs (50) are formed through the base plate (10) at positions (20). Screw holes (22) are drilled into the edge (14) of the package and tapped. The holes are placed symmetrically around the edge and are sized to accept standard screws (46). This can be seen more clearly with reference to FIG. 3, which depicts the base plate as seen from the bottom.

The wafer retaining wall (24), which may also be referred to as a ring or shim, is cut, stamped, or molded into a trefoil shape. The outer dimensions of the shim (24) match the outer dimensions of the base plate (10). The inner dimensions of the shim (24) are large enough that once the wafers (28) are secured in place they do not make contact with the shim (24). Holes (26) are drilled through the top and bottom of the shim (24) to allow screws (46) to pass through. The thickness of the shim (24) is chosen so that the wafers will be held snugly in the package.

Alternatively, the base plate (10) and the retaining wall (24) may be formed into a unit, either by welding or brazing or otherwise permanently attaching the retaining wall (24) to the base plate (10), or by machining or stamping or otherwise forming the base plate (10) with an integral retaining wall (24). In such a unit, the retaining wall (24) forms a lip, or edge, which is separated by a groove, formed by the inside surface of retaining wall (24) and the outside surface of pedestal (12), from the pedestal (12) of the base plate (10).

Vanes (30) are formed from aluminum foil. The vanes (30) are of sufficient length to extend from the shim (24) to near the center of the wafers and of sufficient width to exhibit sufficiently low electrical resistance and inductance. The conformal layer (32) is cut, stamped, or otherwise formed into a trefoil shape. The conformal layer (32) is large enough to cover most of the area of the wafers (28) but it does not extend past the edges of the wafers (28). A foil layer (34) is cut, stamped, or otherwise formed to a size slightly larger than the base plate (10).

Figure 4:
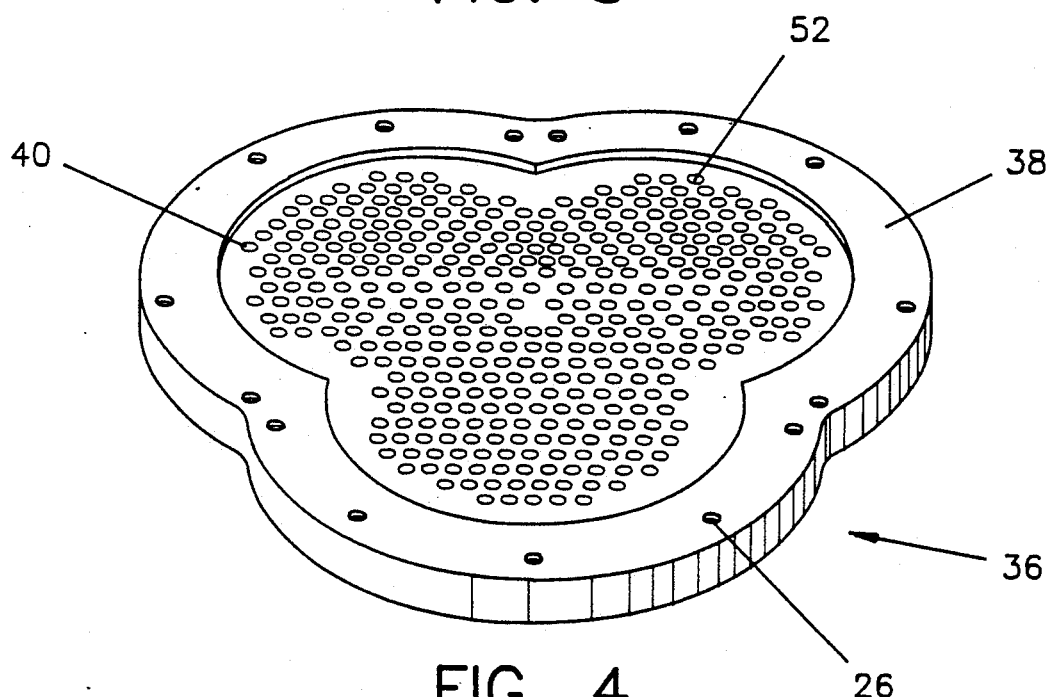
FIG. 4 is a perspective view of the bottom of the intermediate plate of the current invention.

The intermediate spring retainer plate (36) is cut, stamped, or molded into a trefoil shape. The outer dimensions of the intermediate plate (36) match the outer dimensions of the base plate (10). The bottom (38) of the intermediate plate (36) is hollowed under its central portion, forming a three-lobed well (52), as can be seen more clearly in FIG. 4. When the package is assembled, the wafers (28) fit into the three-lobed well (52). Small holes (40) are formed, preferably by drilling, through the central portion of the three-lobed well (52). The position and the quantity of the small holes (40) are chosen according to the configuration of the different modules to be packaged. These holes (40) are of appropriate diameter to accept springs (42). The springs should have a spring constant large enough to hold the wafers in place when the springs are compressed, but small enough not to break the wafers during compression. The springs are held in place by the foil layer (34) when the package is disassembled. The foil layer may be retained during assembly, or omitted if desired. Holes (26) are drilled through the top and bottom of the intermediate plate (36) at its edge to allow screws (46) to pass through.

If desired, a transition structure, i.e., a bonding ridge or bar, may be formed integrally with the base plate, the shim, or the intermediate plate, or it may be formed separately and later attached to one of these pieces. This structure can be a piece of transmission line which serves an a convenient common connection point for electrically joining modules.

The cover plate (44) is cut, stamped, or molded into a trefoil shape. The outer dimensions of the cover plate (44) match the outer dimensions of the base plate (10). The cover plate (44) is flat, with holes (26) drilled completely through to allow screws (46) to pass through. The cover plate (44) may be attractively decorated, for example with a company logo or other design.

All of the machined parts in our preferred embodiment are made of gold-coated aluminum. We use springs made of beryllium-copper, aluminum foil for the contacting vanes and foil layer, and polytetrafluoroethylene (DuPont Teflon TM ) sheet as the conformal material. These materials have been chosen for economic as well as functional reasons. Other materials can be substituted depending on the requirements of the particular application.

The thickness of the base plate at the edge is typically 0.20-0.30 in. The surface of the pedestal is usually about 0.02-0.08 in higher than the edge of the base plate and the pedestal begins about 0.2-0.8 in from the outer edge of the base plate. The wells are recessed from the bottom of the base plate by about 0.1-0.3 in. The distance from the center of the package to the edge of the pedestal depends on the size of the modules to be packaged. For packaging 2-inch (50 mm) wafers the distance is approximately 1.4-1.9 in. The thickness of the shim again depends on the thickness of the individual modules and the number to be stacked, but for two 250 μm wafer layers in a stripline configuration the thickness is about 0.1 in. The thickness of the intermediate plate is largely dependent on the size and strength of the springs. In one case the intermediate plate is about 0.10-0.15 in at the outer edge, and the interior three-lobed well is recessed from the bottom of the intermediate plate by about 0.02-0.06 in. The spring holes are approximately 0.08-0.12 in. in diameter. The cover plate can be virtually any thickness, but is usually 0.02-0.12 in thick at the outer edge.

The foil layer should be thin enough that it can be conformably wrapped around the spring retaining plate. In order to avoid contamination the foil must be cleaned thoroughly to remove any residual lubricant from its manufacture. The conformal material is used to transmit the pressure of the springs evenly. To accomplish this the material must be tough enough that a thin layer resists tearing by the action of the springs, it must be flexible, and it must retain these properties over a wide range of operating temperatures.

For some applications stray magnetic fields adversely affect the performance of electronic and microwave devices. In those cases, all materials used in the construction of the package must be non-magnetic. Yet other applications may find the deliberate addition of magnetic materials to be useful for absorbing undesired signals by improving the frequency response of the device.

The external shape of the package, while not of primary importance, can influence the performance of the packaged device. Excess metal, for example a square rather than trefoil external shape, adds weight and volume. Weight can be an important consideration if the devices are to be part of a sensor array system on an airplane or spacecraft. Volume and mass affect the cooling rate and the thermal budget of the packaged device. The amount of cooling power needed for a given packaged device increases with increasing volume and mass. Added volume can decrease the efficiency of the cooling by making it difficult to maintaining good thermal contact. Excess mass requires more heat to be removed in order to operate at the same temperature. Since cooling equipment takes up space and adds weight, decreasing the amount of coolant required is an advantage of compact packaging.

OPERATIONAL DESCRIPTION

Three wafers (28) are processed to form a microwave device. The wafers (28) are then trimmed, forming truncated circles with two straight edges. When only one wafer is used, as in the prior art, two electrical connections are made along each straight edge. To date, the spacing of these connections has been determined by the dimensions of a standard connector and convenient operation. In the three-lobed package, interconnections are made along two pairs of adjacent straight edges while electrical connection to the external leads is made along the third pair. Ideally, each edge is formed by two congruent chords which intersect at the circumference of the wafer to form a 120° internal angle. This configuration allows acceptably large line length along the straight edge while retaining as much area as possible. Small deviations from the angle are tolerable, and the cuts can be adjustably positioned, within limits, to avoid damaged or imperfect areas of the wafer.

The wafers (28) are next positioned atop the pedestal of the base plate (10) so that the points of the three angles come together at essentially the center of the pedestal (12). Sufficient space is left between the wafers to allow for thermal expansion and contraction during thermal cycling. The wells (48) may be evacuated at this time to secure the wafers (28) while slight adjustments are made to their positions. Each well may be evacuated separately or all wells may be evacuated simultaneously.

Figure 5:
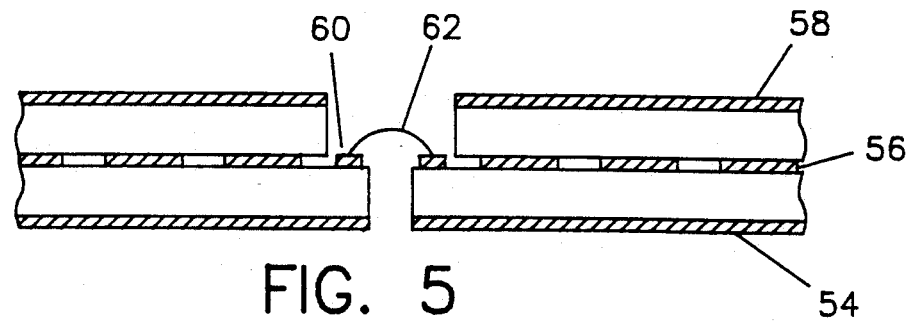
FIG. 5 is a schematic side view of a direct interconnection between two stripline modules.

Interconnections between modules are made at this time. A detail of the interconnection is shown in FIG. 5 for devices having the stripline configuration. The lower wafer is patterned with a bottom ground plane (54), the delay line (56) and bonding pads (60). One end of a wire (62) is bonded to a pad (60) and the other end of the wire (62) is bonded either to the bond pad (60) of another wafer or to a transition structure between the wafers. The transition structure is a piece of transmission line formed in a different configuration, for example a microstrip line. The top wafer is cut to a slightly smaller diameter than the lower wafer. The top ground plane (58) is thus recessed from the edge to allow room for the bonding wire (62) and bond pads (60). The bottom ground plane (54) may be recessed or may be flush with the edge of the delay line pattern (56).

When the wafers (28) are in place, the shim is set on top of the edge of the base plate (10). Pegs or rods (not shown) may be put in the screw holes (22) for ease of alignment.

Next the foil vanes (30) are laid across the wafers so that one edge of each vane (30) lies atop a wafer (28) and the other extends across the shim (24). Vanes (30) are also laid across the wafers so as to make connections across the individual wafer modules. The conformal layer (32) is placed on top of the vanes (30) and the wafers (28). Care should be taken to ensure that the conformal material does not extend past the edges of the wafers (30). The foil layer (34) lies on top of the conformal layer (32). The foil should extend well past the outer edges of the conformal layer (32) at this time. The alignment pegs or rods can pierce the foil to pass through it.

The intermediate plate (36) settles on top of the foil layer (34) with the wafers (28) resting inside the three-lobed well (52). The pegs or rods can be of use in aligning the intermediate plate (36) with the shim (24) and the base plate (10). One spring (42) is dropped into each spring hole (40). To avoid losing the springs (42) the foil layer (34) is wrapped around the edges of the intermediate plate (36), and can be extended to completely enclose the springs in the intermediate plate.

Finally the cover plate (44) is placed on top of the intermediate plate (36) and aligned with the rest of the package. Screws (46) are inserted from the top of the cover plate (44), through the intermediate plate (36), foil layer (34), and the shim (24), and into the tapped holes (22) in the base plate (10). As the screws (46) are inserted, the pegs or rods, if used, are withdrawn to make room. The screws (46) are tightened, securing the package. Excess foil can be trimmed or folded out of the way.

ALTERNATIVE EMBODIMENTS OF THE INVENTION

Microwave devices other than delay lines can, of course, be secured inside the trefoil package. In fact, any electronic device that could benefit from a coplanar cascaded arrangement could be protected by it. Depending on the devices and the end use application, the package could be adapted in several ways.

For stripline devices in particular, better connections to the top ground plane could be made by using another transition structure. This structure could be part of the base, shim, or intermediate plate, or it could be a separate piece. The structure reaches the height of the top ground plane, and provides a convenient location for a wire bond between the top ground plane and the package. The structure is place close to the connection points (20) to reduce parasitic inductance.

Similarly, a ridge of transmission line can be place between wafers for ease in wire bonding. Instead of directly connecting the individual wafer modules, each module could be bonded to the ridge. This would be particularly advantageous for modules having the stripline configuration, where the bonds between modules occur at the center layer.

For microstrip and coplanar waveguide configurations, the intermediate plate would be adapted slightly. Since these configurations have only one wafer layer, the springs should press only at the outer edge of the wafers. To avoid shorting, space should be left between the top of package and the top of the patterned wafers.

If even more delay length is desired, several cascades can be stacked vertically. In this embodiment each layer is composed of multiple modules cascaded together, and two or more cascade layers are vertically connected. The package thickness is adjusted by using a thicker shim, or by using more than one shim.

Packaged devices can be stacked to provide more complicated systems. This alternative embodiment is similar to stacking several layers of modules inside the package. Here, however, interconnections between layers are external to the individual packages. The ease of interconnection may compensate for the addition of metal layers between modules for some applications. In fact, the intervening metal layers could be incorporated to advantage for some system designs.

CONCLUSION, RAMIFICATIONS AND SCOPE

Thus the reader can see that the lobed package for microwave delay lines provides an elegant solution to the problem of serially connecting delay line modules into a compact unit for testing and use.

While the above description contains many specific details, these should not be construed as limitations on the scope of the invention, but rather as an exemplification of one preferred embodiment of it. Many other variations are possible. For example, a two-lobed package might be preferred in some applications. In other applications it might be desirable to stack two layers of three coplanar wafers, for a total of six wafers, in one package. Other variations will no doubt occur to those skilled in the microwave and packaging arts.

Additional advantages and modifications will no doubt be found by those using the above-described package. Therefore, the scope of the invention should be determined not by the embodiment illustrated, but by the appended claims and their legal equivalents.

What is claimed is:

1. A package for electronic devices, comprising:
   a base for supporting a plurality of wafer-scale modules coplanar with one another and in close proximity to one another,
   said base comprising at least two lobes,
   and a retaining means for holding said modules in place on said base,
   said retaining means comprising a retaining plate having a plurality of holes therethrough, a plurality of springs adapted to fit within said holes, and a cover plate,
   whereby when said retaining plate is placed atop said wafer-scale modules and said plurality of springs is placed in said plurality of holes and said cover plate is placed atop said retaining plate, said springs retain said wafer-scale modules in place on said base.

2. The package of claim 1 wherein said base is adapted to hold two of said wafer-scale modules.

3. The package of claim 1 wherein said base has a two-lobed shape to support said wafer-scale modules.

4. The package of claim 2 wherein said wafer-scale modules are circular wafers which have been truncated along a chord of the circle to form a straight edge.

5. The package of claim 4 wherein said wafer-scale modules are positioned on said base oriented to place the straight edges adjacent to one another in close proximity, thus forming a two-lobed geometry.

6. The package of claim 1 wherein said base is adapted to hold three of said wafer-scale modules.

7. The package of claim 1 wherein said base has a three-lobed shape to support said wafer-scale modules.

8. The package of claim 7 wherein said wafer-scale modules are circular wafers which have been truncated along two chords of the circle to form straight edges which meet at the edge of the circle forming an angle of approximately 120°.

9. The package of claim 8 wherein said wafer-scale modules are positioned on said base oriented with the vertices of their 120° angles in close proximity to one another and their straight edges adjacent to one another in close proximity, thus forming a three-lobed geometry.

10. The package of claim 9 wherein said wafer-scale modules are microwave devices operating in the frequency range from about 300 MHz to about 300 GHz.

11. A package for protecting electronic devices and for electrically connecting them to external circuitry comprising:
- a base plate having a lip at its periphery, a groove inside said lip, and a trefoil-shaped support surface inside said groove for supporting a plurality of wafer-scale modules,
- a layer of metallic foil vanes which rests atop said wafer-scale modules, said metallic foil vanes extending from near the center of said wafer-scale modules past said lip, and disposed so as to make electrical contact with said wafer-scale modules and with said trefoil-shaped base plate,
- a layer of resilient material which rests atop said metallic foil vanes and which covers an area less than said wafer-scale modules,
- a trefoil-shaped top retaining plate having the same external dimensions as said trefoil-shaped base plate,
- said trefoil-shaped top retaining plate making electrical contact to said metallic foil vanes,
- and a cover resting atop the retaining plate, affixed to said trefoil-shaped base plate through all intervening layers by an appropriate attachment means.

12. The package of claim 11 wherein said wafer-scale modules are microwave devices operating in the frequency range from about 300 MHz to about 300 GHz.

13. A package for protecting electronic devices and for electrically connecting them to external circuitry comprising:
- a base plate having a raised central trefoil-shaped support surface for supporting a plurality of wafer-scale modules and an edge region surrounding said support surface,
- a layer of metallic foil vanes which rests atop said wafer-scale modules, said metallic foil vanes extending from near the center of said wafer-scale modules into said edge region, and disposed so as to make electrical contact with said wafer-scale modules and with said base plate,
- a layer of resilient material which rests atop said metallic foil vanes and which covers an area less than said wafer-scale modules,
- a top retaining plate having the same external dimensions as said base plate,
- said top retaining plate making electrical contact to said metallic foil vanes,
- and a cover resting atop the retaining plate, affixed to said base plate through all intervening layers by an appropriate attachment means.

14. The package of claim 13 wherein said wafer-scale modules are microwave devices operating in the frequency range from about 300 MHz to about 300 GHz.

* * * * *